US008542304B2

(12) United States Patent
Maeda et al.

(10) Patent No.: US 8,542,304 B2
(45) Date of Patent: Sep. 24, 2013

(54) SOLID-STATE IMAGING DEVICE

(75) Inventors: Motohiro Maeda, Kawasaki (JP);
Hirofumi Yamashita, Kawasaki (JP);
Nagataka Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 13/052,145

(22) Filed: Mar. 21, 2011

(65) Prior Publication Data
US 2011/0234875 A1     Sep. 29, 2011

(30) Foreign Application Priority Data

Mar. 23, 2010  (JP) ................. 2010-066944

(51) Int. Cl.
*H04N 9/083*    (2006.01)
*H04N 3/14*     (2006.01)
*H04N 5/335*    (2011.01)
*H04N 9/04*     (2006.01)

(52) U.S. Cl.
USPC ......................................... 348/281; 348/308

(58) Field of Classification Search
USPC ........................................... 348/281
See application file for complete search history.

(56) References Cited

U.S. PATENT DOCUMENTS

| 2005/0266597 | A1* | 12/2005 | Rhodes ........................... 438/48 |
| 2009/0295973 | A1* | 12/2009 | Oshikubo et al. ............. 348/311 |
| 2009/0322917 | A1* | 12/2009 | Kyogoku et al. .............. 348/273 |
| 2010/0002117 | A1* | 1/2010  | Iwane et al. ................... 348/308 |

FOREIGN PATENT DOCUMENTS

| CN | 101252140 A1 | 8/2008 |
| JP | 2006-237361 | 9/2006 |
| JP | 2007-123765 | 5/2007 |
| JP | 2008-270299 A | 11/2008 |
| JP | 2009-16810 | 1/2009 |
| JP | 2009-266843 A | 11/2009 |
| JP | 2010-16450 A | 1/2010 |
| WO | WO 2007/108129 A1 | 9/2007 |

OTHER PUBLICATIONS

Office Action issued Jun. 19, 2012 in Japanese Patent Application No. 2010-066944 (with English-language translation).
Chinese Office Action mailed Feb. 25, 2013, in Chinese Patent Application No. 201110071977.9 (with English Translation).
Japanese Office Action mailed Jan. 22, 2013, in Japanese Patent Application No. 2010-066944 filed Mar. 23, 2010 (with English Translation).

* cited by examiner

*Primary Examiner* — Albert Cutler
(74) *Attorney, Agent, or Firm* — Oblon, Spivak, McClelland, Maier & Neustadt, L.L.P.

(57) ABSTRACT

According to one embodiment, a solid-state imaging device includes first and second pixel portions, first and second transfer transistors, first and second accumulation portions, an element isolation region, first and second amplifier transistors, and a first and second signal lines. The first and second pixel portions include photoelectric conversion elements, respectively. The first and second transfer transistors transfer first and second charges photoelectrically converted by the first and second pixel portions, respectively. The first and second accumulation portions are interposed between the first and second pixel portions, and accumulate the first and second charges, respectively. The element isolation region is interposed between the first and second accumulation portions. The first and second amplifier transistors amplify voltages generated in accordance with the first and second charges accumulated in the first and second accumulation portions, respectively. The first and second signal lines output signal voltages amplify by the amplifier transistors, respectively.

7 Claims, 5 Drawing Sheets

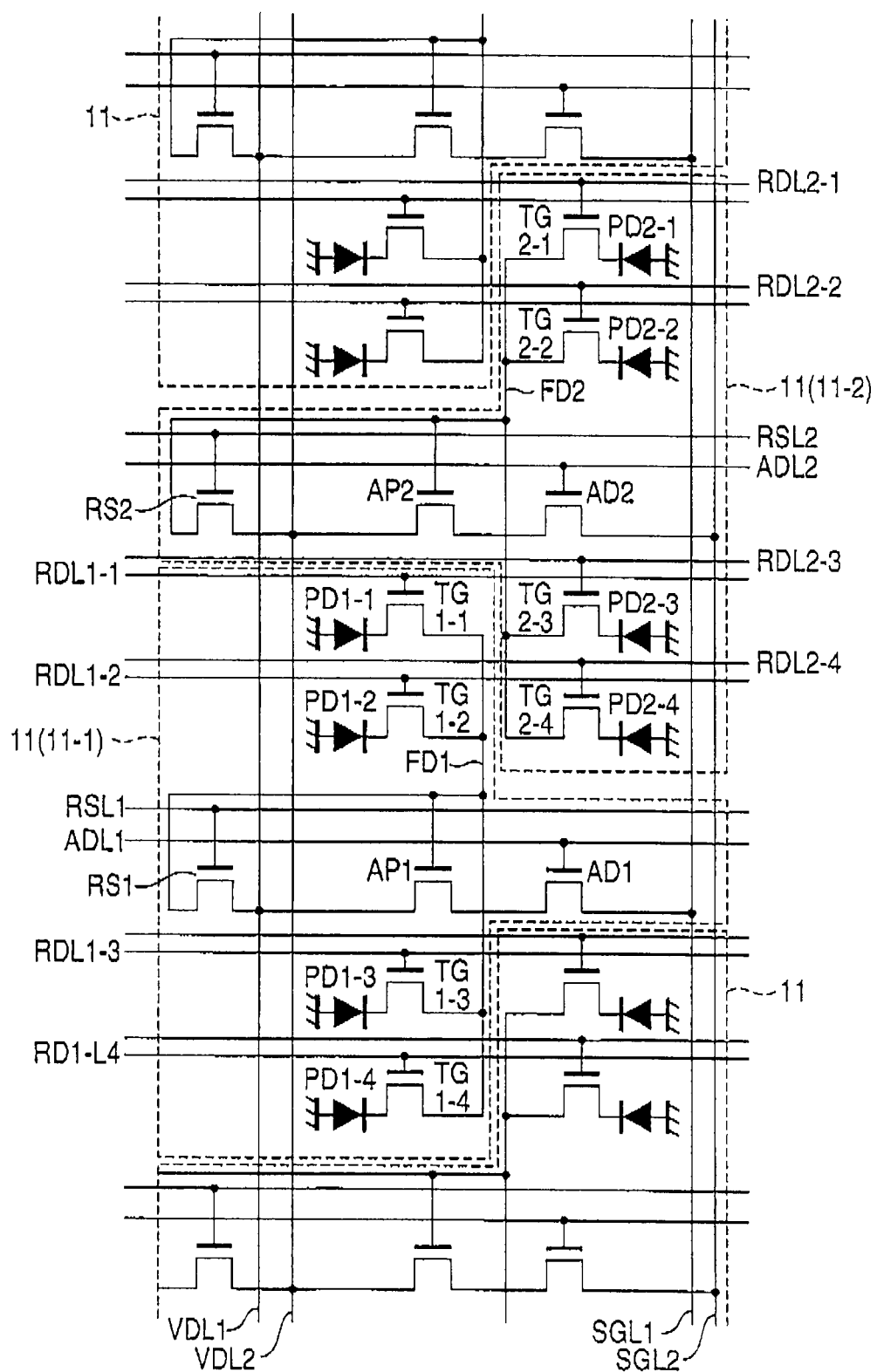
F I G. 1

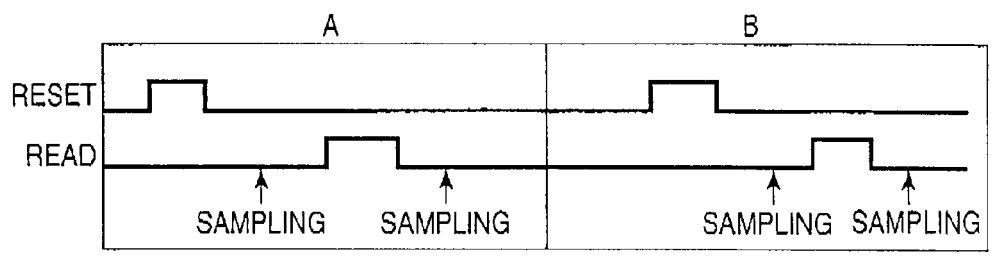
F I G. 7
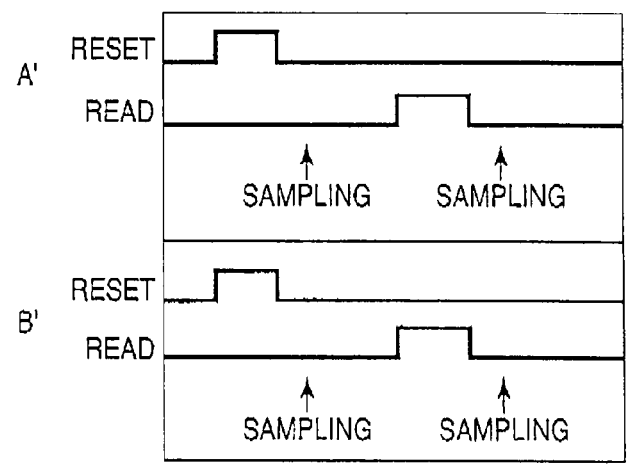
F I G. 8

US 8,542,304 B2

SOLID-STATE IMAGING DEVICE

CROSS-REFERENCE TO RELATED APPLICATIONS

This application is based upon and claims the benefit of priority from Japanese Patent Application No. 2010-066944, filed Mar. 23, 2010; the entire contents of which are incorporated herein by reference.

FIELD

Embodiments described herein relate generally to a solid-state imaging device.

BACKGROUND

Solid-state imaging devices such as a CMOS sensor are decreasing their pixel size year after year to meet demands for more pixels and smaller optical sizes. For example, the pixel size of a CMOS sensor used in a digital camera or the like has reached about 2 μm to 3 μm recently.

A smaller pixel size results in a smaller area of a photodiode arranged in a pixel. Hence, the number of saturated electrons accumulated in the photodiode decreases, failing to ensure sufficient signal charges. Shortage of signal charges decreases the S/N ratio, and noise stands out on the reproduction screen.

For example, to increase the number of saturated electrons in the photodiode, there is proposed a layout in which four pixels share one floating diffusion to decrease the number of floating diffusions and increase the photodiode area.

In the layout of four pixels in one cell in which four pixels form one unit cell, the floating diffusion is arranged at the center and surrounded by four pixels. This layout can reduce the number of floating diffusions, compared to, e.g., a layout of two pixels in one cell in which two pixels share one floating diffusion. This can increase the photodiode area and thus increase the number of saturated electrons accumulated in the photodiode.

However, in the layout of four pixels in one cell, when reading out signal charges from pixels arrayed on one row, while signal charges are read out from one pixel, no signal charge can be read out from its adjacent pixel, failing speedup of the readout operation.

BRIEF DESCRIPTION OF THE DRAWINGS

FIG. 1 is a circuit diagram showing a solid-state imaging device according to an embodiment;

FIG. 7 is a timing chart showing a readout operation in the solid-state imaging device in the comparative example; and FIG. 8 is a timing chart showing a readout operation in the solid-state imaging device according to the embodiment.

DETAILED DESCRIPTION

Figure 2:
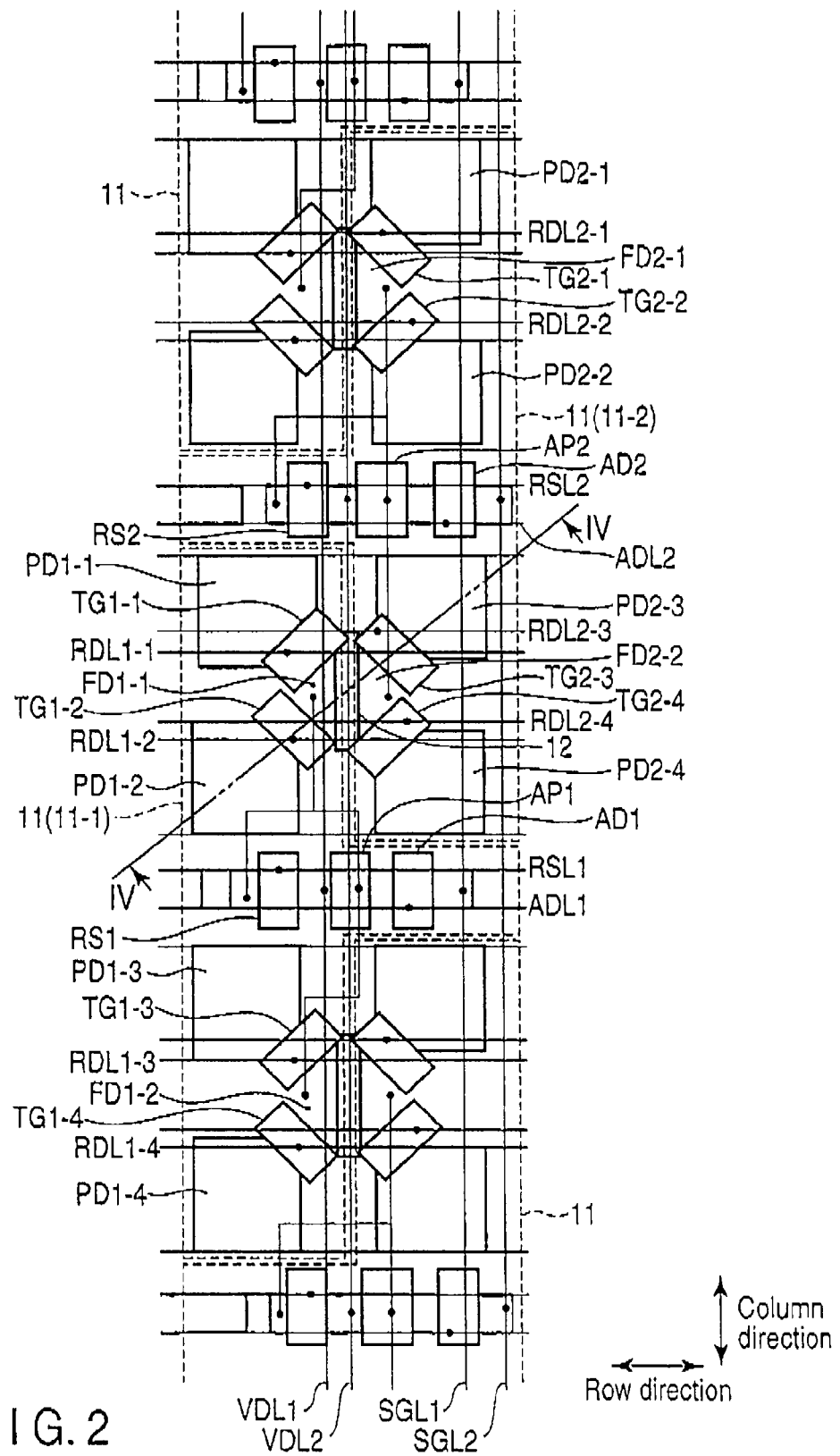
FIG. 2 is a diagram showing the layout of the solid-state imaging device according to the embodiment.

A solid-state imaging device according to an embodiment will be described below with reference to the accompanying drawing. In the following description, the same reference numerals denote the same parts throughout the drawing.

In general, according to one embodiment, a solid-state imaging device includes a first pixel portion, a second pixel portion, a first transfer transistor, a second transfer transistor, a first accumulation portion, a second accumulation portion, an element isolation region, a first amplifier transistor, a first signal line, a second amplifier transistor, and a second signal line. The first pixel portion includes a photoelectric conversion element. The second pixel portion is arranged in a row direction with respect to the first pixel portion and includes a photoelectric conversion element. The first transfer transistor is configured to transfer a first charge photoelectrically converted by the first pixel portion. The second transfer transistor is configured to transfer a second charge photoelectrically converted by the second pixel portion. The first accumulation portion is interposed between the first pixel portion and the second pixel portion, and accumulates the first charge transferred by the first transfer transistor. The second accumulation portion is interposed between the first pixel portion and the second pixel portion, and accumulates the second charge transferred by the second transfer transistor. The element isolation region is interposed between the first accumulation portion and the second accumulation portion, and electrically isolates the first accumulation portion from the second accumulation portion. The first amplifier transistor is configured to amplify a voltage generated in accordance with the first charge accumulated in the first accumulation portion. The first signal line is configured to output a signal voltage amplified by the first amplifier transistor. The second amplifier transistor is configured to amplify a voltage generated in accordance with the second charge accumulated in the second accumulation portion. The second signal line is configured to output a signal voltage amplified by the second amplifier transistor.

[1] Embodiment

[1-1] Circuit Configuration

The circuit configuration of a solid-state imaging device according to the embodiment will be explained.

FIG. 1 is a circuit diagram showing a solid-state imaging device according to the embodiment.

As shown in FIG. 1, the solid-state imaging device includes a plurality of unit cells 11 arrayed in a matrix. The circuit configuration will be explained using a first unit cell 11-1, and a second unit cell 11-2 arranged to be adjacent to the first unit cell 11-1.

The unit cell 11-1 has the following circuit configuration.

The unit cell 11-1 includes a plurality of photoelectric conversion elements, e.g., four photodiodes PD1-1, PD1-2, PD1-3, and PD1-4, transfer gates (transfer transistors) TG1-1, TG1-2, TG1-3, and TG1-4, an amplifier gate (amplifier transistor) AP1, a reset gate (reset transistor) RS1, and an address gate (address transistor) AD1.

The cathode of the photodiode PD1-1 is connected to a node FD1 via the current path of the transfer gate TG1-1. The cathode of the photodiode PD1-2 is connected to the node FD1 via the current path of the transfer gate TG1-2. The cathode of the photodiode PD1-3 is connected to the node FD1 via the current path of the transfer gate TG1-3. Further, the cathode of the photodiode PD1-4 is connected to the node FD1 via the current path of the transfer gate TG1-4.

The node FD1 corresponds to a floating diffusion to be described later, and floats when the transfer gates TG1-1 to TG1-4 and the reset gate RS1 are OFF.

The node FD1 is connected to the gate of the amplifier gate AP1 and one end of the current path of the reset gate RS1. The other end of the current path of the reset gate RS1 is connected to one end of the current path of the address gate AD1 via the current path of the amplifier gate AD1. Further, the other end of the current path of the address gate AD1 is connected to a signal line SGL1.

Read lines RDL1-1, RDL1-2, RDL1-3, and RDL1-4 are connected to the gates of the transfer gates TG1-1, TG1-2, TG1-3, and TG1-4, respectively. A reset line RSL1 is connected to the gate of the reset gate RS1, and a power supply voltage line VDL1 is connected to the other end of the current path of the reset gate RS1. Further, an address line ADL1 is connected to the gate of the address gate AD1.

Similarly, the unit cell 11-2 has the following circuit configuration.

The unit cell 11-2 includes a plurality of photoelectric conversion elements, e.g., four photodiodes PD2-1, PD2-2, PD2-3, and PD2-4, transfer gates TG2-1, TG2-2, TG2-3, and TG2-4, an amplifier gate AP2, a reset gate RS2, and an address gate AD2.

The cathode of the photodiode PD2-1 is connected to a node FD2 via the current path of the transfer gate TG2-1. The cathode of the photodiode PD2-2 is connected to the node FD2 via the current path of the transfer gate TG2-2. The cathode of the photodiode PD2-3 is connected to the node FD2 via the current path of the transfer gate TG2-3. Further, the cathode of the photodiode PD2-4 is connected to the node FD2 via the current path of the transfer gate TG2-4.

The node FD2 corresponds to a floating diffusion to be described later, and floats when the transfer gates TG2-1 to TG2-4 and the reset gate RS2 are OFF.

The node FD2 is connected to the gate of the amplifier gate AP2 and one end of the current path of the reset gate RS2. The other end of the current path of the reset gate RS2 is connected to one end of the current path of the address gate AD2 via the current path of the amplifier gate AP2. Further, the other end of the current path of the address gate AD2 is connected to a signal line SGL2.

Read lines RDL2-1, RDL2-2, RDL2-3, and RDL2-4 are connected to the gates of the transfer gates TG2-1, TG2-2, TG2-3, and TG2-4, respectively. A reset line RSL2 is connected to the gate of the reset gate RS2, and a power supply voltage line VDL2 is connected to the other end of the current path of the reset gate RS2. Further, an address line ADL2 is connected to the gate of the address gate AD2.

[1-2] Layout

The layout of the solid-state imaging device according to the embodiment will be explained.

FIG. 2 is a diagram showing the layout of the solid-state imaging device according to the embodiment.

As described above, the solid-state imaging device includes a plurality of unit cells 11 arrayed in a matrix. The layout will be explained similarly using the first unit cell 11-1, and the second unit cell 11-2 arranged to be adjacent to the first unit cell 11-1.

The unit cell 11-1 includes a plurality of photoelectric conversion elements, e.g., the four photodiodes PD1-1, PD1-2, PD1-3, and PD1-4, the transfer gates TG1-1, TG1-2, TG1-3, and TG1-4, the amplifier gate AP1, the reset gate RS1, the address gate AD1, and floating diffusions (first accumulation portions) FD1-1 and PD1-2.

The unit cell 11-2 includes a plurality of photoelectric conversion elements, e.g., the four photodiodes PD2-1, PD2-2, PD2-3, and PD2-4, the transfer gates TG2-1, TG2-2, TG2-3, and TG2-4, the amplifier gate AP2, the reset gate RS2, the address gate AD2, and floating diffusions (second accumulation portions) FD2-1 and FD2-2.

As shown in FIG. 2, the photodiodes PD1-1 to PD1-4 are arrayed in the column direction. The transfer gate TG1-1 is arranged near the photodiode PD1-1, and the transfer gate TG1-2 is arranged near the photodiode PD1-2. The floating diffusion FD1-1 is arranged near the transfer gates TG1-1 and TG1-2.

The transfer gate TG1-3 is arranged near the photodiode PD1-3, and the transfer gate TG1-4 is arranged near the photodiode PD1-4. The floating diffusion FD1-2 is arranged near the transfer gates TG1-3 and TG1-4.

The amplifier gate AP1, reset gate RS1, and address gate AD1 are interposed between the photodiodes PD1-2 and PD1-3.

The read lines RDL1-1, RDL1-2, RDL1-3, and RDL1-4 are connected to the gates of the transfer gates TG1-1, TG1-2, TG1-3, and TG1-4, respectively. The reset line RSL1 is connected to the gate of the reset gate RS1, and the power supply voltage line VDL1 is connected to the other end of the current path of the reset gate RS1. The address line ADL1 is connected to the gate of the address gate AD1. Further, the signal line SGL1 is connected to the output terminal of the address gate AD1.

In the same manner, the photodiodes PD2-1, PD2-2, PD2-3, and PD2-4 are arrayed in the column direction. The transfer gate TG2-1 is arranged near the photodiode PD2-1, and the transfer gate TG2-2 is arranged near the photodiode PD2-2. The floating diffusion FD2-1 is arranged near the transfer gates TG2-1 and TG2-2.

The transfer gate TG2-3 is arranged near the photodiode PD2-3, and the transfer gate TG2-4 is arranged near the photodiode PD2-4. The floating diffusion FD2-2 is arranged near the transfer gates TG2-3 and TG2-4.

The amplifier gate AP2, reset gate RS2, and address gate AD2 are interposed between the photodiodes PD2-2 and PD2-3.

The read lines RDL2-1, RDL2-2, RDL2-3, and RDL2-4 are connected to the gates of the transfer gates TG2-1, TG2-2, TG2-3, and TG2-4, respectively. The reset line RSL2 is connected to the gate of the reset gate RS2, and the power supply voltage line VDL2 is connected to the other end of the current path of the reset gate RS2. The address line ADL2 is connected to the gate of the address gate AD2. Further, the signal line SGL2 is connected to the output terminal of the address gate AD2.

The unit cells 11-1 and 11-2 are adjacent to each other in the row direction, and are shifted by two photodiodes (two pixels) in the column direction. That is, the photodiodes PD2-3 and PD2-4 of the unit cell 11-2 are arranged in the row direction of the photodiodes PD1-1 and PD1-2 of the unit cell 11-1.

The floating diffusions FD1-1 and FD2-2 are arranged to be surrounded by the photodiodes PD1-1, PD1-2, PD2-3, and PD2-4. In addition, an element isolation region 12, for example, an STI (Shallow Trench Isolation) or p-type semiconductor region is formed between the floating diffusions FD1-1 and FD2-2 to electrically insulate the floating diffusions FD1-1 and FD2-2.

The transfer gate TG1-1 is interposed between the photodiode PD1-1 and the floating diffusion FD1-1. The transfer gate TG1-2 is interposed between the photodiode PD1-2 and the floating diffusion FD1-1.

The transfer gate TG2-3 is interposed between the photodiode PD2-3 and the floating diffusion FD2-2. The transfer gate TG2-4 is interposed between the photodiode PD2-4 and the floating diffusion FD2-2.

A plurality of unit cells 11-1 and 11-2 are arrayed in the row and column directions, forming a solid-state imaging device.

Figure 3:
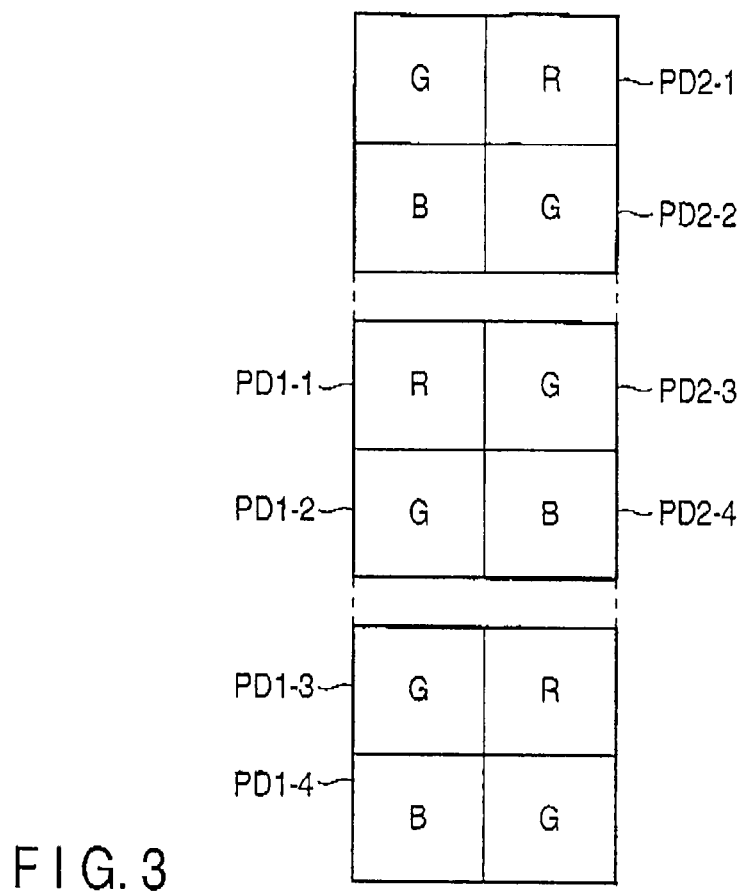
FIG. 3 is a view showing a pixel array in the solid-state imaging device according to the embodiment.

FIG. 3 shows a color filter array in the solid-state imaging device having the above layout. As shown in FIG. 3, R (Red), G (Green), and B (Blue) color filters are arranged on the photodiodes PD1-1, PD1-2, PD1-3, and PD1-4 of the unit cell 11-1, and the photodiodes PD2-1, PD2-2, PD2-3, and PD2-4 of the unit cell 11-2, respectively. In this fashion, the color filter array in the solid-state imaging device is a Bayer array.

In the layout of the embodiment, four pixels (four photodiodes) arrayed in the column direction form one unit cell (four pixels in one cell), and cells each of four pixels are arranged in the row direction while shifting them by two pixels in the column direction. Further, a floating diffusion surrounded by four pixels is divided into two parts by an element isolation region, and the respective floating diffusions are assigned to separate unit cells.

Sharing one floating diffusion by four pixels can increase the photodiode area, compared to arranging one floating diffusion for one to three pixels. Hence, a sufficient number of saturated electrons accumulated in the photodiode can be ensured.

[1-3] Sectional Structure of Pixel Portion

The sectional structure of the pixel portion in the solid-state imaging device according to the embodiment will be described.

Figure 4:
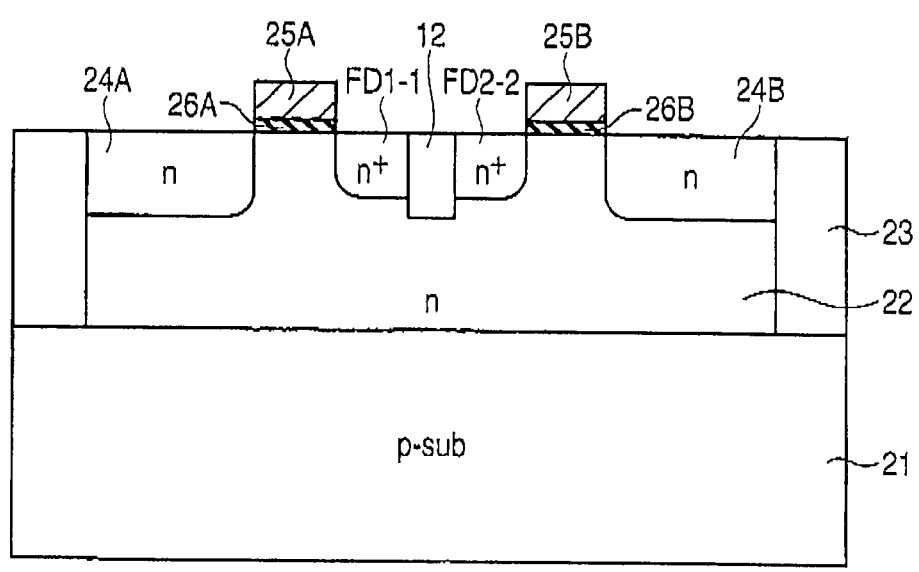
FIG. 4 is a sectional view taken along the line IV-IV in FIG. 2.

FIG. 4 is a sectional view taken along the line IV-IV in FIG. 2, and shows the sectional structure of the photodiode, transfer gate, floating diffusion, and element isolation region.

As shown in FIG. 4, an n-type semiconductor layer (e.g., epitaxial layer) 22 is formed on a semiconductor substrate (e.g., p-type semiconductor substrate) 21. An element isolation layer 23, for example, an STI (Shallow Trench Isolation) or p-type semiconductor layer is formed around the n-type semiconductor layer 22.

In the n-type semiconductor layer 22, n-type semiconductor regions 24A and 24B are formed to be isolated from each other so as to form the two photodiodes PD1-2 and PD2-3. Gate electrodes 25A and 25B are formed between the n-type semiconductor regions 24A and 24B to form the two transfer gates TG1-2 and TG2-3. Gate insulating films 26A and 26B are formed between the gate electrodes 25A and 25B and the n-type semiconductor layer 22, respectively.

The floating diffusions FD1-1 and FD2-2 are formed in the n-type semiconductor layer 22 between the gate electrodes 25A and 25B. The floating diffusions FD1-1 and FD2-2 are formed from n$^+$-type semiconductor regions.

Further, the element isolation region 12 is formed between the floating diffusions FD1-1 and FD2-2. The element isolation region 12 is formed from, e.g., an STI or p-type semiconductor region.

Note that the conductivity type of each semiconductor member which forms the sectional structure of the pixel portion is not limited to the above-mentioned one, and the other conductivity type is also available.

[1-4] Readout Operation

A readout operation in the solid-state imaging device according to the embodiment will be explained.

In the solid-state imaging device, readout of a plurality of pixels is executed for each row in a plurality of pixels arrayed in a matrix. More specifically, charges are transferred from photodiodes for each row on which a plurality of photodiodes are arrayed. A readout operation from the photodiodes PD1-1 and PD2-3 arranged on the first row and the photodiodes PD1-2 and PD2-4 arranged on the second row following the first row will be described.

Readout from the photodiodes PD1-1 and PD2-3 arranged on the first row is as follows.

First, in the signal accumulation period, while the transfer gates TG1-1, TG1-2, TG2-3, and TG2-4 are OFF, charges are accumulated in the photodiodes PD1-1, PD2-3, PD1-2, and PD2-4.

Then, the transfer gate TG1-1 is turned on to transfer electrons accumulated in the photodiode PD1-1 to the floating diffusion PD1-1. Simultaneously when the transfer gate TG1-1 is turned on, the transfer gate TG2-3 is turned on to transfer electrons accumulated in the photodiode PD2-3 to the floating diffusion FD2-2. That is, electrons accumulated in the photodiodes PD1-1 and PD2-3 are transferred to the floating diffusions FD1-1 and FD2-2 in a horizontal synchronizing period, respectively. The electrons may be simultaneously transferred to the floating diffusions FD1-1 and FD2-2. When turning off the transfer gates TG1-1 and TG2-3, 0 V or a negative voltage is applied to the gates. When turning on the transfer gates TG1-1 and TG2-3, a positive voltage, e.g., 3.5 V is applied to the gates.

The signal charges transferred to the floating diffusion FD1-1 are amplified by the amplifier gate AP1, and output to the signal line SGL1 via the address gate AD1. At the same time, the signal charges transferred to the floating diffusion FD2-2 are amplified by the amplifier gate AP2, and output to the signal line SGL2 via the address gate AD2. That is, the signal charges transferred to the floating diffusions FD1-1 and FD2-2 are output from the signal lines SGL1 and SGL2 in a horizontal synchronizing period, respectively. The signal charges may be simultaneously output from the signal lines SGL1 and SGL2.

That is, the amplifier gate AP1 amplifies a voltage generated in accordance with the signal charges transferred to the floating diffusion FD1-1, and outputs it as a signal voltage to the signal line SGL1. Similarly, the amplifier gate AP2 amplifies a voltage generated in accordance with the signal charges transferred to the floating diffusion FD2-2, and outputs it as a signal voltage to the signal line SGL2.

The address gates AD1 and AD2 are turned on or off in accordance with address signals input to the address lines ADL1 and ADL2, respectively, and control output of signal voltages to the signal lines SGL1 and SGL2.

Since readout from the photodiodes PD1-1 and PD2-3 arranged on the same row is simultaneously executed, the readout operation from pixels arrayed on one row can be completed by one readout.

Next, readout from the photodiodes PD1-2 and PD2-4 arranged on the second row is as follows.

The reset gates RS1 and RS2 are turned on to reset signal charges in the floating diffusions FD1-1 and FD2-2, respectively. That is, the potentials of the floating diffusions FD1-1 and FD2-2 are set to the power supply voltage VDD. Further, electrons accumulated in the photodiodes PD1-2 and PD2-4 and other photodiodes are discharged.

Then, in the signal accumulation period, while the transfer gates TG1-1, TG1-2, TG2-3, and TG2-4 are OFF, charges are accumulated in the photodiodes PD1-1, PD2-3, PD1-2, and PD2-4.

Subsequently, the transfer gate TG1-2 is turned on to transfer electrons accumulated in the photodiode PD1-2 to the floating diffusion FD1-1. Simultaneously when the transfer gate TG1-2 is turned on, the transfer gate TG2-4 is turned on to transfer electrons accumulated in the photodiode PD2-4 to the floating diffusion FD2-2. When turning off the transfer gates TG1-2 and TG2-4, 0 V or a negative voltage is applied to the gates. When turning on the transfer gates TG1-2 and TG2-4, a positive voltage, e.g., 3.5 V is applied to the gates.

The signal charges transferred to the floating diffusion FD1-1 are amplified by the amplifier gate AP1, and output to the signal line SGL1 via the address gate AD1. At the same time, the signal charges transferred to the floating diffusion FD2-2 are amplified by the amplifier gate AP2, and output to the signal line SGL2 via the address gate AD2.

That is, the amplifier gate AP1 amplifies a voltage generated in accordance with the signal charges transferred to the floating diffusion FD1-1, and outputs it as a signal voltage to the signal line SGL1. Similarly, the amplifier gate AP2 amplifies a voltage generated in accordance with the signal charges transferred to the floating diffusion FD2-2, and outputs it as a signal voltage to the signal line SGL2.

The address gates AD1 and AD2 are turned on or off in accordance with address signals input to the address lines ADL1 and ADL2, respectively, and control output of signal voltages to the signal lines SGL1 and SGL2.

In the solid-state imaging device, readout of a plurality of pixels is done for each row in a plurality of pixels arrayed in a matrix. In the embodiment, electrons accumulated in the photodiode PD2-3 (or PD2-4) are transferred to the floating diffusion FD2-2 in parallel with transferring electrons accumulated in the photodiode PD1-1 (or PD1-2) to the floating diffusion FD1-1. As a result, detection of electrons accumulated in the photodiode PD1-1 (or PD1-2) and that of electrons accumulated in the photodiode PD2-3 (or PD2-4) can be performed parallelly. When reading out charges from pixels arrayed on one row, the readout operation can be completed by one readout, implementing a high-speed operation.

Figure 5:
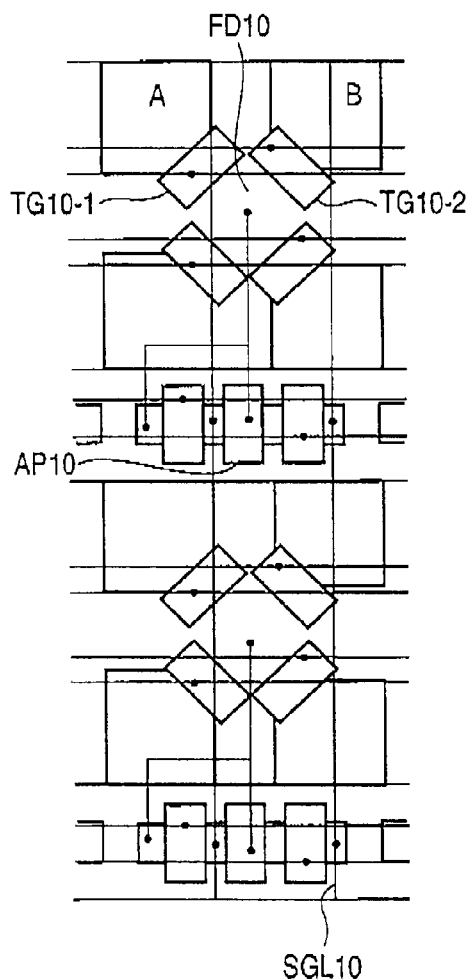
FIG. 5 is a diagram showing the layout of a solid-state imaging device in a comparative example.
Figure 6:
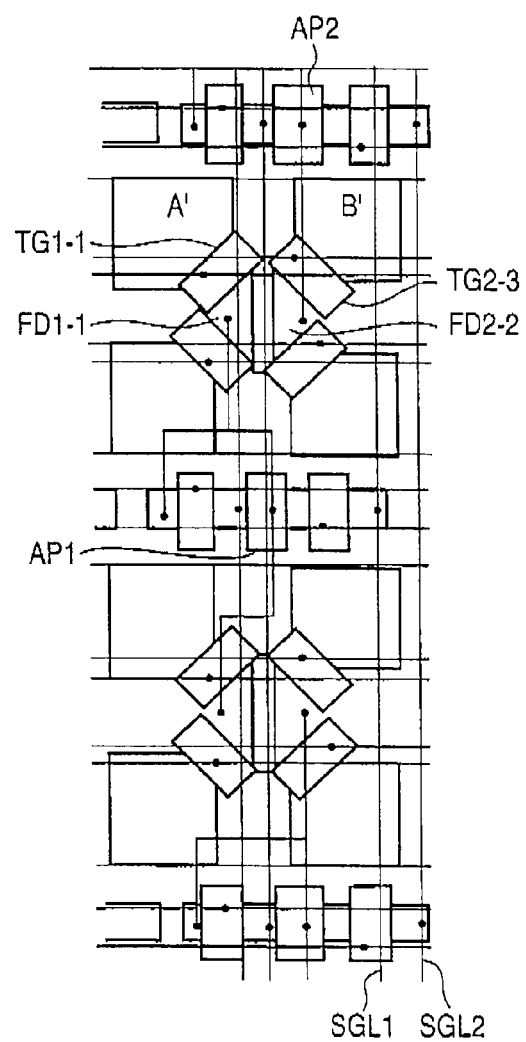
FIG. 6 is a diagram showing the layout of the solid-state imaging device according to the embodiment.

Speedup of the readout operation in the embodiment will be explained in comparison with a comparative example. FIG. 5 is a diagram showing a layout in the comparative example, and FIG. 7 is a timing chart showing a readout operation in the comparative example. FIG. 6 is a diagram showing a layout in the embodiment, and FIG. 8 is a timing chart showing a readout operation in the embodiment.

In the solid-state imaging device of the comparative example, photodiodes A and B are arranged on the same row, as shown in FIG. 5. The photodiode A is connected to a floating diffusion FD10 via a transfer gate TG10-1. The photodiode B is connected to the floating diffusion FD10 via a transfer gate TG10-2. That is, the photodiodes A and B are connected to the common floating diffusion FD10. Further, the floating diffusion FD10 is connected to a signal line SGL10 via an amplifier gate AP10.

In the comparative example having this arrangement, charges accumulated in the photodiodes A and B are read out to the signal line SGL10 using the common floating diffusion FD10 and amplifier gate AP10. To read out charges accumulated in the photodiodes A and B, readout needs to be executed twice. More specifically, as shown in FIG. 7, charges accumulated in the photodiode A are read out by the first readout, and those accumulated in the photodiode B are read out by the second readout.

To the contrary, in the embodiment, charges accumulated in a photodiode A' are read out to the signal line SGL1 using the floating diffusion FD1-1 and amplifier gate AP1. Also, charges accumulated in a photodiode B' are read out to the signal line SGL2 using the floating diffusion FD2-2 and amplifier gate AP2.

For this reason, charges accumulated in the photodiodes A' and B' can be simultaneously read out. More specifically, as shown in FIG. 8, charges accumulated in the photodiodes A' and B' can be read out by one readout. In the embodiment, therefore, readout can be achieved at the double the speed in the comparative example.

[1-5] Effects

In the embodiment, sharing one floating diffusion by four pixels (four photodiodes) can increase the photodiode area, compared to arranging one floating diffusion for one to three pixels. Therefore, a sufficient number of saturated electrons accumulated in the photodiode can be ensured.

The floating diffusion is divided into two parts by the element isolation region, and the respective floating diffusions are assigned to separate unit cells. Electrons accumulated in adjacent photodiodes on the same row can be simultaneously read out to separate floating diffusions.

Four pixels arrayed in the column direction form one unit cell (four pixels in one cell), and cells each of four pixels are arranged in the row direction while shifting them by two pixels in the column direction. With this arrangement, amplifier gates arranged in the vertical direction can detect voltage amplitudes in the two divided parts of the floating diffusion. Hence, readout from pixels on one row can be completed by one readout.

Even at small pixel size, a sufficient number of saturated electrons accumulated in the photodiode can be ensured, and the readout operation can be executed quickly.

As described above, the embodiment solves the problem that a sufficient number of saturated electrons cannot be ensured when the pixel size decreases, and the problem that no high-speed operation can be done when the number of pixels sharing a floating diffusion increases. In other words, the solid-state imaging device can ensure a sufficient number of saturated electrons (signal charges) even at small pixel size and cope with even a high-speed operation.

The embodiment can provide a solid-state imaging device which can ensure a sufficient number of saturated electrons and perform a high-speed readout operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging device comprising:
   a first pixel portion including a photoelectric conversion element;
   a second pixel portion which is arranged in a row direction with respect to the first pixel portion, the second pixel portion including a photoelectric conversion element;
   a first transfer transistor configured to transfer a first charge photoelectrically converted by the first pixel portion;
   a second transfer transistor configured to transfer a second charge photoelectrically converted by the second pixel portion;
   a first accumulation portion which is interposed between the first pixel portion and the second pixel portion, the first accumulation portion accumulating the first charge transferred by the first transfer transistor;
   a second accumulation portion which is interposed between the first pixel portion and the second pixel portion, the second accumulation portion accumulating the second charge transferred by the second transfer transistor;
   an element isolation region which is interposed between the first accumulation portion and the second accumulation portion, the element isolation region electrically isolating the first accumulation portion from the second accumulation portion;

a first amplifier transistor configured to amplify a voltage generated in accordance with the first charge accumulated in the first accumulation portion;

a first signal line configured to output a signal voltage amplified by the first amplifier transistor;

a second amplifier transistor configured to amplify a voltage generated in accordance with the second charge accumulated in the second accumulation portion;

a second signal line configured to output a signal voltage amplified by the second amplifier transistor;

a third pixel portion which is arranged in a same column in a column direction perpendicular to the row direction with respect to the first pixel portion, the third pixel portion including a photoelectric conversion element;

a third transfer transistor configured to transfer a third charge photoelectrically converted by the third pixel portion;

a third accumulation portion which is arranged adjacent to the third pixel portion, the third accumulation portion accumulating the third charge transferred by the third transfer transistor; and a third amplifier transistor configured to amplify a voltage generated in accordance with the third charge accumulated in the third accumulation portion, wherein the first signal line outputs a signal voltage amplified by the third amplifier transistor, the first pixel portion includes a first pixel, a second pixel, a third pixel, and a fourth pixel which are arrayed sequentially in the column direction and include photoelectric conversion elements, respectively, the first pixel, the second pixel, the third pixel, the fourth pixel, the first transfer transistor, the first accumulation portion, and the first amplifier transistor form a first unit cell, the second pixel portion includes a fifth pixel, a sixth pixel, a seventh pixel, and an eighth pixel which are arrayed sequentially in the column direction and include photoelectric conversion elements, respectively, the fifth pixel, the sixth pixel, the seventh pixel, the eighth pixel, the second transfer transistor, the second accumulation portion, and the second amplifier transistor form a second unit cell, the first unit cell and the second unit cell are arranged in the row direction to be adjacent to each other, and the second unit cell is shifted from the first unit cell by two pixels in the column direction, the first pixel included in the first pixel portion and the sixth pixel included in the second pixel portion are arranged on the same row, in a readout operation, charges photoelectrically converted by the first pixel and the sixth pixel are transferred to the first accumulation portion and the second accumulation portion in a first horizontal synchronizing period, respectively, and the charges transferred to the first accumulation portion and the second accumulation portion are output from the first signal line and the second signal line in a second horizontal synchronizing period, respectively.

2. The device according to claim 1, wherein
in the readout operation, the charges are simultaneously transferred to the first accumulation portion and the second accumulation portion, and
the charges transferred to the first accumulation portion and the second accumulation portion are simultaneously output from the first signal line and the second signal line.

3. The device according to claim 1, wherein
the first amplifier transistor is interposed between the second pixel and the third pixel, and
the second amplifier transistor is interposed between the sixth pixel and the seventh pixel.

4. The device according to claim 1, wherein the element isolation region is formed of an STI (Shallow Trench Isolation).

5. The device according to claim 1, wherein the first accumulation portion and the second accumulation portion are formed of semiconductor regions of a first conductivity type, and the element isolation region is formed of a semiconductor region of a second conductivity type.

6. The device according to claim 1, wherein
the first transfer transistor is interposed between the photoelectric conversion element included in the first pixel portion and the first accumulation portion, and
the second transfer transistor is interposed between the photoelectric conversion element included in the second pixel portion and the second accumulation portion.

7. The device according to claim 1, further comprising:
a plurality of first unit cells each including the first unit cell; and
a plurality of second unit cells each including the second unit cell,
wherein the first unit cells and the second unit cells are arrayed in the row direction and the column direction.

* * * * *